United States Patent [19]
Dekker

[11] Patent Number: 5,847,604
[45] Date of Patent: Dec. 8, 1998

[54] LINEARIZER FOR LINEARIZING A NON-LINEAR COMPONENT CONTROLLED BY CONTROL VOLTAGE

[75] Inventor: André Dekker, Oulu, Finland

[73] Assignee: Nokia Telecommunications Oy, Espoo, Finland

[21] Appl. No.: 750,325

[22] PCT Filed: Mar. 12, 1996

[86] PCT No.: PCT/FI96/00151
§ 371 Date: Jan. 28, 1997
§ 102(e) Date: Jan. 28, 1997

[87] PCT Pub. No.: WO96/31946
PCT Pub. Date: Oct. 10, 1996

[30] Foreign Application Priority Data

Apr. 5, 1995 [FI] Finland ..................... 951622

[51] Int. Cl.⁶ ............................................. H03F 1/32
[52] U.S. Cl. ......................... 330/149; 330/85; 330/110
[58] Field of Search ............................... 330/139, 149, 330/85, 110, 228, 279

[56] References Cited

U.S. PATENT DOCUMENTS 3,686,555  8/1972  Younkin .
4,549,146 10/1985  Cowans et al. .
4,774,476  9/1988  Ecklund et al. .
4,816,722  3/1989  Klotz ................................ 330/279

FOREIGN PATENT DOCUMENTS 510 704  10/1992  European Pat. Off. .
511 707  11/1992  European Pat. Off. .
513 402  11/1992  European Pat. Off. .
93/18602  9/1993  WIPO .

*Primary Examiner*—James B. Mullins
*Attorney, Agent, or Firm*—Pillsbury Madison & Sutro LLP

[57] ABSTRACT

Non-linearity of a voltage-controlled non-linear amplifier/attenuator is compensated by placing a non-linear circuit in the feedback path of an operation amplifier of a linearizer, the circuit including one or more differential amplifiers connected in parallel. For example, one amplifier can be a low-gain amplifier whose exponential range is at the lower end of the control voltage range, and another can be a high-gain amplifier whose exponential range is at the upper end of the control voltage range. When a necessary number of differential amplifiers are used in the feedback path, it is possible to compensate for the non-linearity of the non-linear component to a desired extent.

6 Claims, 3 Drawing Sheets

LINEARIZER FOR LINEARIZING A NON-LINEAR COMPONENT CONTROLLED BY CONTROL VOLTAGE

This application is the national phase of international application PCT/FI96/00151, filed Mar. 12, 1996 which designates the U.S.

BACKGROUND OF THE INVENTION

The invention relates to a linearizer comprising an amplifier and a compensating non-linearity located in its feedback path. A linear control voltage applied to the input of the amplifier is transformed in the linearizer such that the non-linearity of the non-linear element controlled by the transformed control voltage is essentially compensated, such that the output voltage of the non-linear element is essentially linearly dependent on the linear control voltage.

In radio unit transmitters, voltage-controlled components, such as RF attenuators and amplifiers, are used. The attenuation/amplification of these components in the adjustment range should be linearly dependent on the adjustment voltage. A typical embodiment is a power levelling loop in which the input power of an RF signal supplied to an amplifier of a transmitter is essentially a constant, and the power of a signal output from the amplifier must be adjusted over a wide range at submicrosecond speed. The characteristic of most voltage-controlled components is non-linear, i.e. without any specific linearization the attenuation G of the amplifier, i.e. the ratio of output voltage $V_{out}$ to input voltage $V_{in}$ as a function of control voltage $V_c$, is as illustrated by the graph of FIG. 1 of the attached drawings. As the control voltage increases from zero, the graph first shows a leakage region 1, where attenuation G has a minimum value. It is almost independent of control voltage $V_c$. As the control voltage increases, a first linear transition region 2 follows. In this region, attenuation is a linear function of the control voltage. The next region is an exponential or dB-linear region 3, where attenuation is an exponential function of the control voltage. With a further increase in the control voltage, a second linear transition region 4 follows. Here, too, attenuation is a linear function of the control voltage. The last region is a saturation region, where attenuation has a maximum value which is almost independent of the control voltage.

In most embodiments, a required property of voltage-controlled components is linearity. As previously known, this can be achieved by the use of a specific linearizer. The objective of the linearizer is to transform the linear control voltage supplied thereto to non-linear control voltage whose characteristic is inverse to the characteristic of the voltage-controlled component, whereby they combine to form a linear characteristic of a voltage-controlled component.

FIG. 2 shows the principle of a typical inverting linearizer known in the field. A non-linear circuit 22 is placed in the feedback path of a high-gain non-linear operation amplifier 21. The input of the amplifier is the voltage $V_{LIN}$ to be linearized, and from the output is obtained non-linear control voltage $V_c$, which is supplied to a voltage-controlled attenuator/amplifier 23, where it compensates for non-linearity G.

In order that non-linearity G could be compensated, it should be either a monotonically ascending or monotonically descending function of control voltage $V_c$, whereby it can be represented by formula (1):

$$G(V_c) = g_{00} \pm g_{01}(A \cdot (V_c - V_{01})) = g_{00} \pm g_{01}(V_0) \qquad (1)$$

where $g_{00}$ is a constant and $g_{01}$ is a monotonically ascending function. $V_{01}$ is an offset term and A is a scaling factor, which are used for expressing non-linearity G as a function of voltage $V_0$. The non-linear circuit 22, which can be called a compensating non-linearity, produces a feedback current $I_0 = I_{00} \pm I_{01}(V_0)$, where $I_{00}$ is a constant part and $I_{01}$ is a part dependent on voltage $V_0$. Voltage $V_0$ is obtained from output voltage $V_c$ by scaling by A and offsetting by $V_{01}$. The scaling and offsetting can be performed using resistor networks. The plus sign is used when the amplifier is a non-inverting amplifier, and the minus sign when it is an inverting one. Non-linearity $I_{01}$ is called the compensating non-linearity, whereas function $g_{01}$ can be called the non-linearity to be compensated. If the amplifier 21 has infinite gain, it will try to make the voltages at the input poles equal, so that the following equation holds true:

$$V_{LIN} = (I_{00} \pm I_{01}(V_0))R \qquad (2)$$

When the above equation (2) is compared with formula (1), it can be seen that G is a linear function of $V_{LIN}$ if $I_{01}(V_0)$ is a linear function of $g_{01}(V_0)$. Terms $I_{00}$ and $g_{00}$ have no effect on the linearization, but they cause a fixed offset, whereby the compensation requirement for $I_{01}$ is $$I_{01}(V_0) = p + q \cdot g_{01}(V_0),$$

where p and q are arbitrary constants.

The tendency in modern voltage-controlled attenuators is to make the exponential range (i.e. dB-linear region) as large as possible and to minimize the linear range. In some attenuators, the second linear region 4, as depicted in FIG. 1, is very narrow, and in some places the gain in region 3 rises even more than exponentially. The known linearizers, such as those previously presented by the inventor of the present invention, do not enable linearization of such non-linear components in the entire characteristic, especially not in regions 2, 3 and 4 of the curve shown in FIG. 1.

SUMMARY OF THE INVENTION

The object of the present invention is to provide a linearizer without the drawbacks of the known solutions. The object is to provide a non-linear circuit whose characteristic in as wide a region as possible is the same as the characteristic of the non-linearity to be compensated.

In the invention, the non-linear implementation of a circuit, i.e. of the compensating non-linearity, is based on a known differential amplifier according to FIG. 3, the amplifier being called below an LTP (Long Tailed Pair). Transistors $Q_1$ and $Q_2$ are matched pairs, collector current $I_1$ of transistor $Q_1$ is the desired current $I_{01}(I_1 = I_{01})$ and the collector current of transistor $Q_2$ is $I_2 = I_t - I_{01}$. An LTP like this produces the non-linearity of formula (3):

$$I_{01} = \tfrac{1}{2} \cdot I_t \cdot (1 + \tan h(V_0 / 2V_T)) \qquad (3)$$

where $I_t$ is a tail current, which is the current $I_t$ of a constant-current source and simultaneously the sum of the collector currents, and $V_t$ is a voltage proportional to the absolute temperature, being about 26 mV at room temperature. Reference number 31 indicates a current generator that produces constant current $I_t$. In the other figures, the current generator is indicated by the same symbol. The linear region of the graph of one LTP (not shown), however, is large as compared with the exponential region, which is not sufficient to compensate the large non-linear region. In the invention, a non-linear circuit to be placed in the feedback path of the operation amplifier is formed by combining at least two LTPs, one of which is a low-gain LTP whose exponential region is at the lower end of the control-voltage region, and the other is a high-gain LTP whose exponential region is at the upper end of the control-voltage region. In a non-linear circuit, the non-linearity of a non-linear component can be compensated to a desired extent by the use of a necessary number of LTPs.

In one embodiment of the linearizer of the invention, there is provided a modified LTP where an additional transistor is connected in parallel to the transistors of the basic connection, the collector of the additional transistor being connected to the collector of one transistor of the basic connection and its emitter being connected to the emitters of the basic connection. The voltage affecting at the base of the additional transistor is output voltage $V_c$ of the operation amplifier, although it has been offset and scaled independently. This connection will be called below an LTP-plus. The non-linearities of the LTP-plus are almost the same as those of a combination of two LTP amplifiers, but it has some drawbacks, which will be discussed below.

BRIEF DESCRIPTION OF THE DRAWINGS

In the following, the invention will discussed in greater detail by means of a preferred embodiment of the invention with reference to the attached drawings, in which:

In FIG. 4, the LTPs, which form the compensating non-linearity element of the feedback path shown in FIG. 2, are connected in parallel such that the input of both LTPs is control voltage $V_c$. At each pair, control voltage $V_c$ is subjected to individual scaling ($A_a$, $A_b$) and level shifting ($-V_{0a}$, $-V_{0b}$). The sum of input currents $I_{01a}$, $I_{01b}$ of the left-hand-side transistors in the pairs, at the base of which control voltage $V_c$ has a functional effect, is $I_1$, and the sum of the input currents of the right-hand-side transistors is $I_2$. A pair of amplifiers is connected to the feedback path of a linearizer in a manner described below (FIG. 2) such that the feedback current is $I_2$. It is also possible to use current $I_1$ as the feedback current, but the signs of the input poles of the operation amplifier should then be changed in the connection illustrated in FIG. 2. This produces a non-inverting linearizer, which, however, has a drawback mentioned below.

Figure 3:
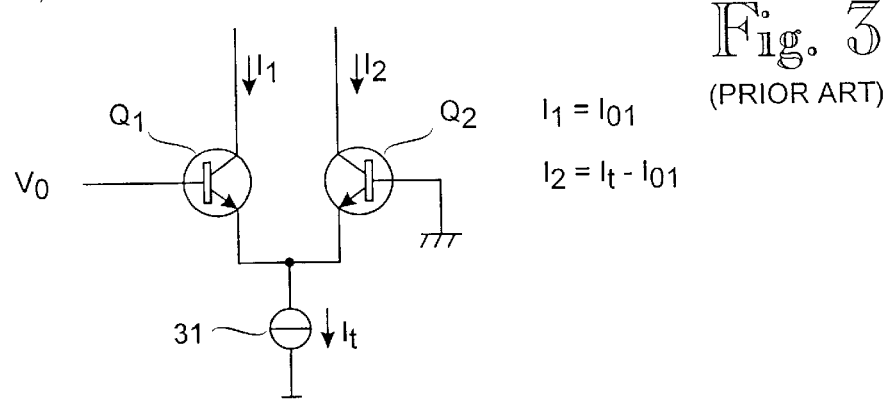
FIG. 3 illustrates an LTP.
Figure 4:
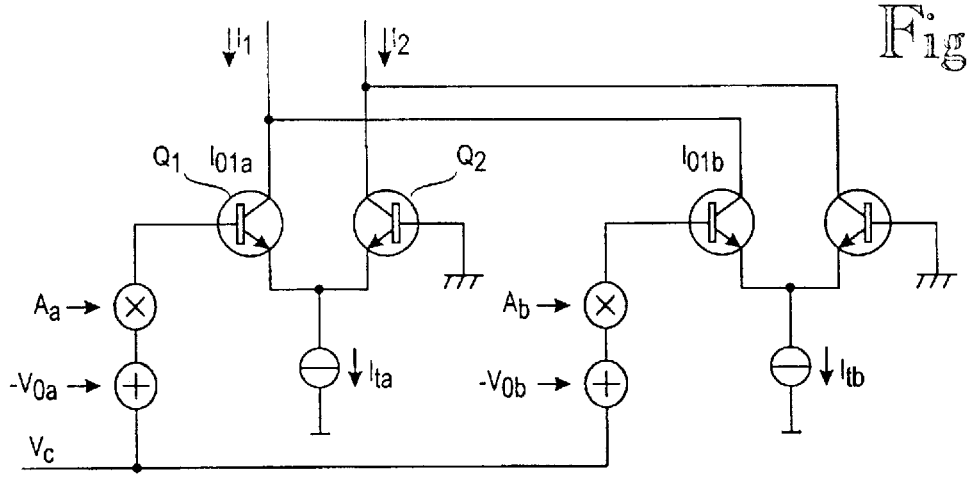
FIG. 4 illustrates a combination of two LTPs.

In a graph (not shown) of the connection illustrated in FIG. 4, the exponential region, i.e. the region where the derivative of current $I_1$ in relation of voltage $V_c$ divided by current $I_1$ is a constant, i.e.

$$\frac{1}{I_1} \frac{dI_1}{dV_c}$$

is a constant, is significantly larger than with the single LTP connection of FIG. 3.

Figure 5:
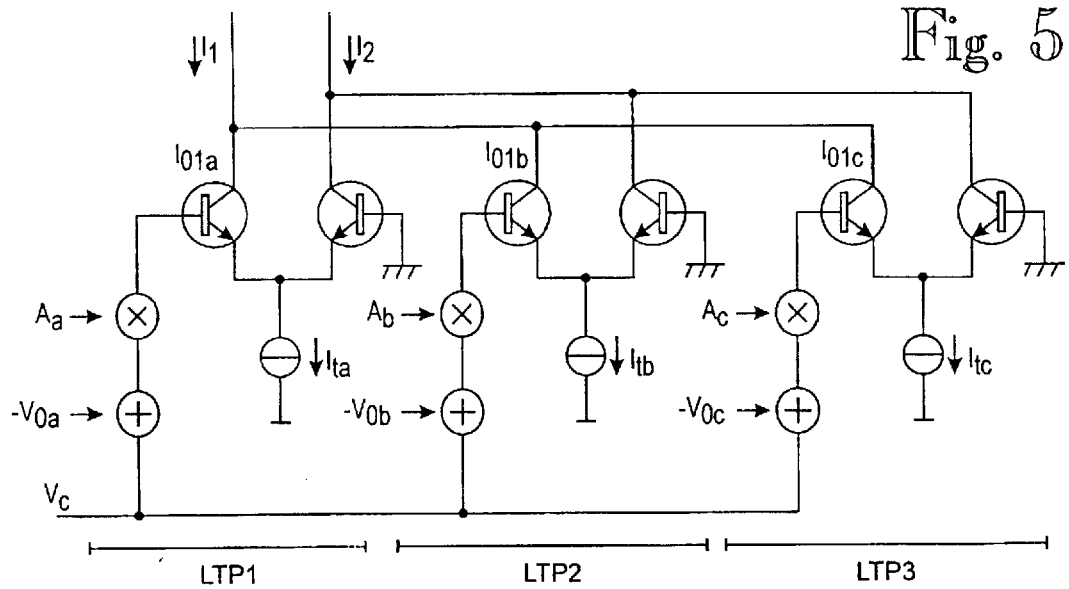
FIG. 5 illustrates a combination of three LTPs.

Any desired number of LTPs can be connected in parallel. Each LTP compensates for its own part of non-linearity, whereby the use of a sufficiently large number of LTPs makes it possible to cause the linearity to be compensated as accurately as desired. The use of three LTPs in accordance with FIG. 5 makes it possible to produce a large number of different non-linearities. The non-linear circuit of FIG. 5 is sufficient for most embodiments.

The use of several LTP amplifiers is advantageous in many ways: for example, adjustment parameters $A_n$ and $V_{0n}$ of each pair have an independent effect, i.e. they do not affect the operation of the other pairs, and the linearity obtained is not very sensitive to any single adjustment parameter. In addition, the circuit can be easily integrated as an analogue IC.

Figure 6:
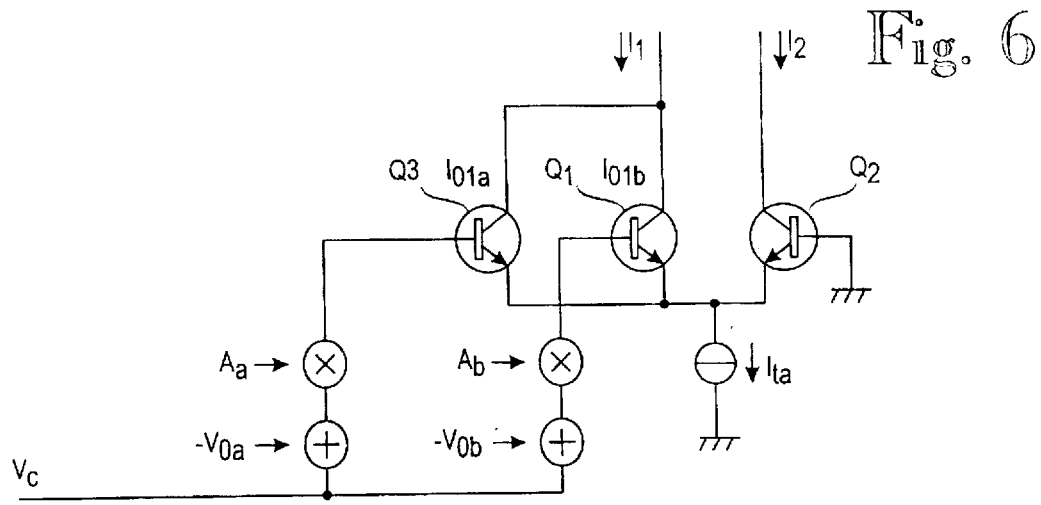
FIG. 6 illustrates an LTP-plus.

An LTP amplifier can be modified in the manner shown in FIG. 6. In the figure, an additional transistor Q3 is connected in parallel to transistor Q1 of the basic LTP, the collector of the former transistor being connected to the collector of the latter LTP transistor Q1, and its emitter being connected to the emitters of the transistors of the basic connection. The voltage affecting at the base of additional transistor Q3 is the same voltage $V_c$ as at the base of the LTP transistors, except that it has been independently offset by term $-V_a$ and scaled by scaling factor $A_a$. In the following, this connection will be called an LTP-plus.

The non-linearity properties of the LTP-plus are almost the same as those of a combination of two LTP amplifiers. However, it is more difficult to design, since the adjustment parameters affect one another. Further, the connection is more sensitive to the tolerances and temperatures of the components than a circuit of two LTPs.

Figure 1A:
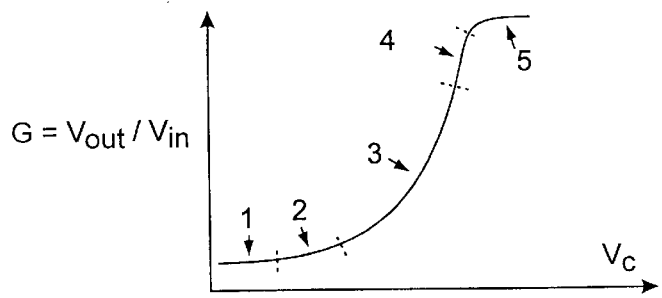
FIG. 1 shows a typical characteristic of a voltage-controlled attenuator.
Figure 7:
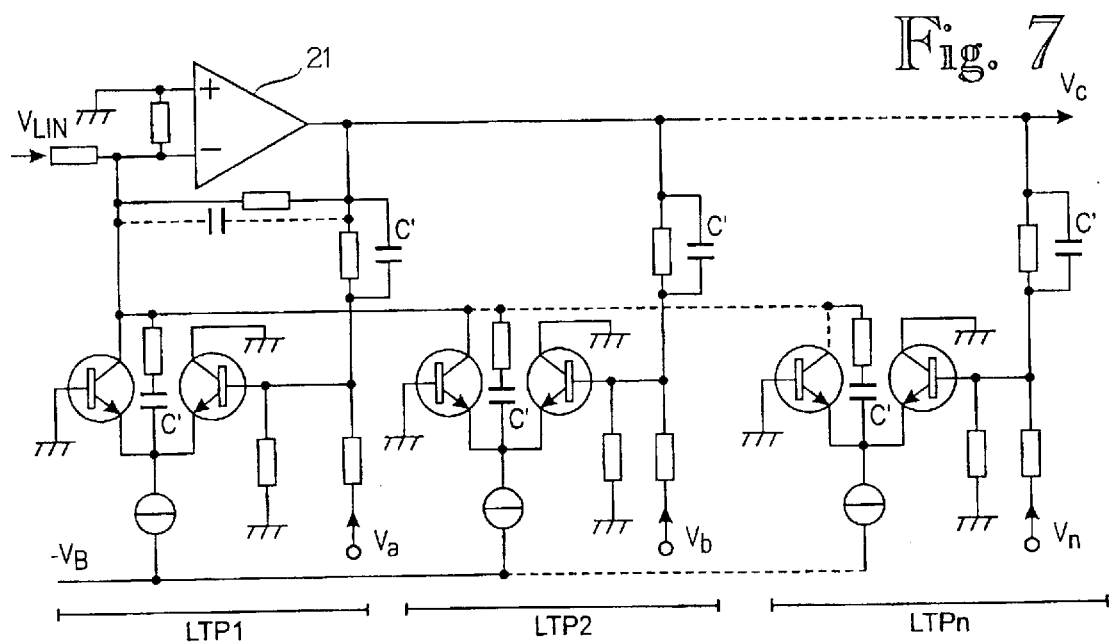
FIG. 7 illustrates a linearizer comprising a non-linear circuit according to the invention.
Figure 8:
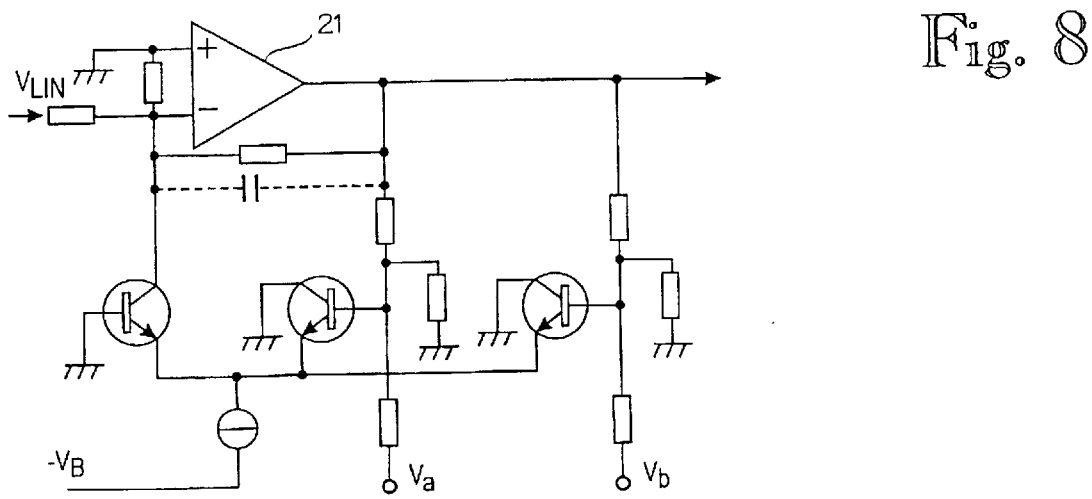
FIG. 8 illustrates a linearizer comprising a modified non-linear circuit.

In practice, linearization circuits have a flat region in the curves of current $I_{01}$ of the feedback path. This is problematic, since it means that the operation amplifier has no feedback in this region. The situation worsens if $I_{01}$ decreases simultaneously as $V_c$ rises very high. This, however, happens only in a non-inverting linearizer when $V_c$ rises so high that the base-collector junction of one of the transistors becomes conductive. This may result in loss of the operating capacity of the linearizer. Because of this, it is not recommendable to use long tailed pairs in a non-inverting linearizer. In an inverting linearizer, even the flat regions are easier to deal with. Further, it has been observed in real voltage-controlled attenuators that they are never completely flat in their useful operating ranges. It is thus possible to place a large resistor between the output of an operation amplifier and an inverting input, as shown in FIGS. 7 and 8. This imitates the first linear region 2 in a typical characteristic of a voltage-controlled amplifier, as shown in FIG. 1.

FIGS. 7 and 8 show a non-linear circuit of the invention in a linearizer. FIG. 7 shows an inverting linearizer with several LTPs, whereas FIG. 8 shows a linearizer with an LTP-plus. Voltage VB is the operating voltage of the non-linear circuit. The figures show inverting amplifiers, but a circuit with non-inverting ones is obtained by interchanging the plus and the minus input of the amplifier, and by using, in the feedback, the collectors of those transistors which are grounded in the figure. Linear feedback, however, has to conducted to the negative input of the amplifier, i.e. the large resistor will have to be placed between the output of the operation amplifier and the inverting input. A non-inverting structure, however, is not recommended for the reasons stated above. It is also possible to use circuits implemented with PNP transistors. In all these circuits, current source $I_t$ can be replaced with a resistor and a suitable voltage source.

FIG. 7 also illustrates ways of modifying the frequency response of the linearizer. To make the frequency response as direct as possible and prevent the circuit from vibrating at just any control voltage, frequency compensation that is dependent on the operating point is needed. It can be implemented by connecting capacitors to the non-linear element. The capacitors are indicated generally in the figure by C'.

In FIGS. 7 and 8, voltages $-V_{0n}$ are normally supply voltages, depending on the fact whether a positive or negative offset is needed. In each LTP of the figures, it is possible to replace the offset supplied to the base of the right arm with the offset supplied to the base of the transistor in the left arm, the latter offset having the opposite sign. In practice, however, it is preferable to connect the base of the transistor in the left arm to the ground.

Figure 9:
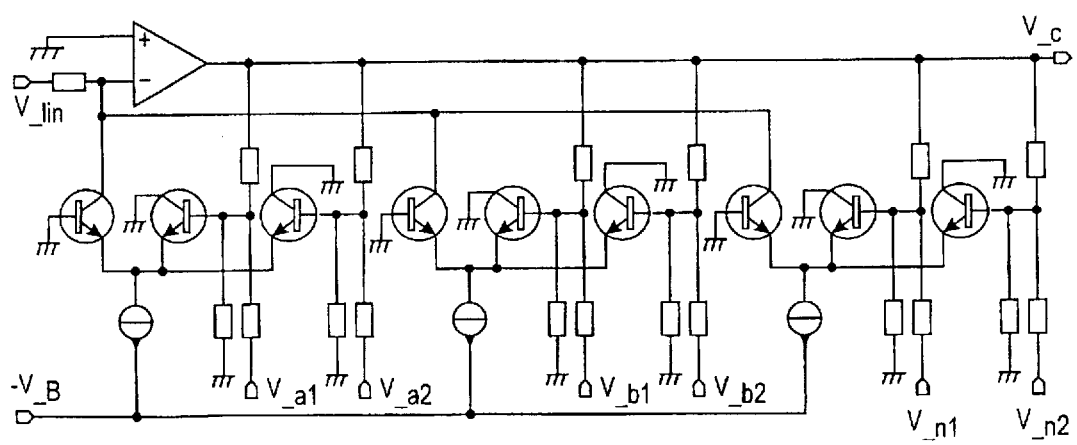
FIG. 9 illustrates a linearizer embodiment in which each differential amplifier is provided with an additional transistor.

In the linearizer embodiment depicted in FIG. 9, a linearizer embodiment is depicted in which each differential amplifier is provided with an additional transistor. Several differential amplifiers are connected in parallel such that the output voltage ($V_c$) of the feedback amplifier supplied to the base of the first transistor of each pair is subjected to individual sealing (A) and individual level shifting ($V_n$). An additional transistor (Q3) is connected in parallel to the differential amplifier such that its collector and emitter are connected, respectively, to the collector and emitter of the first transistor (Q1), and the base of the additional transistor is also functionally connected to the output of the feedback amplifier.

It is to be understood that the above specification and the associated figures are only intended to illustrate the present invention. It will be obvious to one skilled in the art that the invention can be varied and modified in many ways without deviating from the scope and spirit of the invention presented in the attached claims.

I claim:

1. A linearizer for linearizing a non-linear component controlled by a control voltage, by transforming a linear control voltage into a non-linear control voltage, comprising:

a feedback amplifier having an input arranged to have applied thereto the linear control voltage, and an output arranged to provide the non-linear control voltage;

a non-linear circuit placed in a feedback path of said amplifier, said circuit having a non-linearity which is mainly the same as the non-linearity of the voltage-controlled non-linear component which is to be linearized;

said non-linear circuit comprising at least one differential amplifier formed by a matched pair of transistors consisting of a first transistor and a second transistor, each said differential amplifier being connected such that in said pair:

the base of the first transistor is functionally connected to the output of the feedback amplifier, whereby the collector current of the first transistor depends on the voltage of the output of the feedback amplifier, the base of the second transistor is functionally grounded.

the emitters of the first and second transistors are connected together, and the common emitter current is substantially a constant, whereby a change in the collector current of the first transistor causes an opposite change in the collector current of the second transistor, and the collector of the second transistor is connected to the input of the feedback amplifier, and the collector of the first transistor is functionally grounded;

an additional transistor connected in parallel to said at least one differential amplifier such that the collector and emitter of said additional transistor are connected, respectively, to the collector and emitter of said first transistor, and such that the base of said additional transistor is functionally connected to said output of said feedback amplifier.

2. The linearizer according to claim 1, wherein:

said at least one differential amplifier is constituted by a plurality of differential amplifiers;

said differential amplifiers being connected in parallel such that the output of said feedback amplifier, supplied to the base of the first transistor of each said matched pair of transistors, is subjected to individual scaling and individual level shifting.

3. The linearizer according to claim 2, wherein:

non-linearity of said non-linear circuit is arranged to be modified by individual scaling and level shifting to correspond to non-linearity of the non-linear component to be linearized, such that each said differential amplifier compensates for a respective part of the non-linearity of the non-linear component.

4. The linearizer according to claim 1, further comprising:

a constant-current service;

the emitters of said first and second transistors of each said differential amplifier being connected together, and being connected to said constant-current source.

5. A linearizer for linearizing a non-linear component controlled by a control voltage, by transforming a linear control voltage into a non-linear control voltage, comprising:

a feedback amplifier having an input arranged to have applied thereto the linear control voltage, and an output arranged to provide the non-linear control voltage;

a non-linear circuit placed in a feedback path of said amplifier, said circuit having a non-linearity which is mainly the same as the non-linearity of the voltage-controlled non-linear component which is to be linearized;

said non-linear circuit comprising at least one differential amplifier formed by a matched pair of transistors consisting of a first transistor and a second transistor, each said differential amplifier being connected such that in said pair:

the base of the first transistor is functionally connected to the output of the feedback amplifier, whereby the collector current of the first transistor depends on the voltage of the output of the feedback amplifier, the base of the second transistor is functionally grounded, the emitters of the first and second transistors are connected together, and the common emitter current is substantially a constant, whereby a change in the collector current of the first transistor causes an opposite change in the collector current of the second transistor, and the collector of the second transistor is connected to the input of the feedback amplifier, and the collector of the first transistor is functionally grounded;

said at least one differential amplifier being constituted by a plurality of differential amplifiers;

said differential amplifiers being connected in parallel such that the output of said feedback amplifier, supplied to the base of the first transistor of each said matched pair of transistors, is subjected to individual scaling and level shifting.

6. The linearizer according to claim 5, wherein: non-linearity of said non-linear circuit is arranged to be modified by individual scaling and level shifting to correspond to non-linearity of the non-linear component to be linearized, such that each said differential amplifier compensates for a respective part of the non-linearity of the non-linear component.

* * * * *

UNITED STATES PATENT AND TRADEMARK OFFICE
CERTIFICATE OF CORRECTION

PATENT NO. : 5,847,604
DATED : 12/8/98
INVENTOR(S) : Dekker

It is certified that error appears in the above-identified patent and that said Letters Patent is hereby corrected as shown below:

Column 1, line 30, after "amplifier" insert --(see Fig 1B)--.

Column 2, line 31-32, change "1" to --1A--.

Column 2, line 37, change "1" to --1A--.

Column 3, line 28, change "1" to --1A--.

Figure 1B:
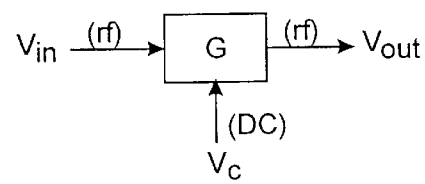
Figure 2:
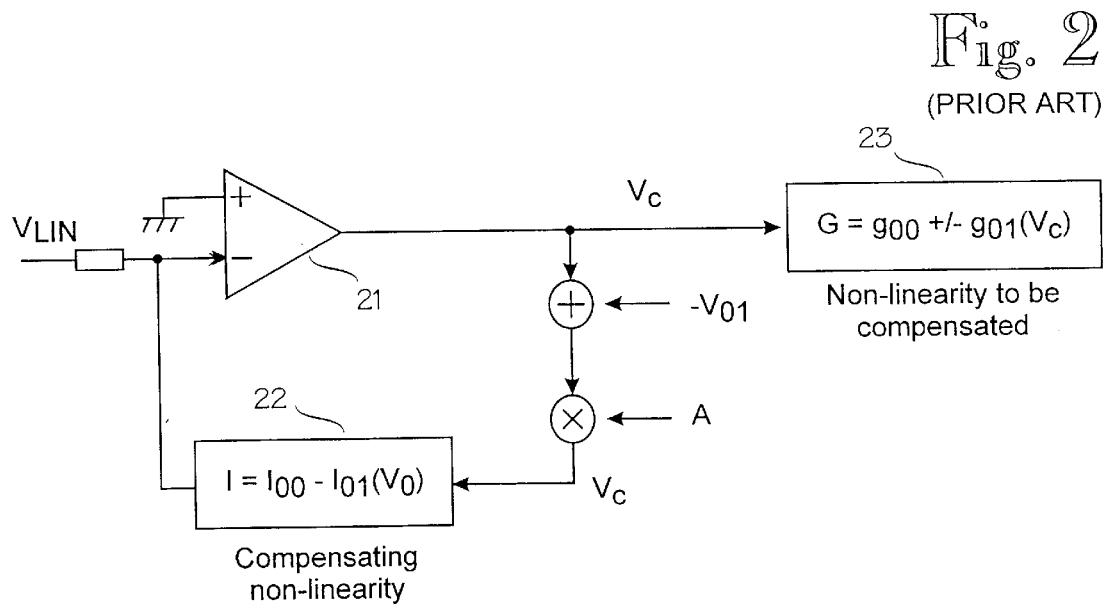
FIG. 2 illustrates a known principle of a linearizer.

Column 3, line 30, insert as a furthe sub-paragraph --Fig. 1B shows a voltage-controlled attenuator,--.

Signed and Sealed this

Second Day of March, 1999

Attest:

Q. TODD DICKINSON

*Attesting Officer*     *Acting Commissioner of Patents and Trademarks*

UNITED STATES PATENT AND TRADEMARK OFFICE
CERTIFICATE OF CORRECTION

PATENT NO.   : 5,847,604
DATED        : December 8, 1998
INVENTOR(S)  : DEKKER

It is certified that error appears in the above-identified patent and that said Letters Patent is hereby corrected as shown below:

Column 1, line 30, after "amplifier", insert -- (see Fig. 1B) --;

Column 1, line 32, change "1" to --1A--;

Column 2, line 32, change "1" to --1A--;

Column 2, line 37, change "1" to --1A--;

Column 3, line 27, change "1" to --1A--; and

Column 3, before line 30, insert as a further sub-paragraph
  -- Fig. 1B shows a voltage-controlled attenuator, --.

This certificate supersedes Certificate of Correction issued March 2, 1999.

Signed and Sealed this

Twelfth Day of September, 2000

Attest:

Q. TODD DICKINSON

*Attesting Officer*   *Director of Patents and Trademarks*